(12) United States Patent
Wang et al.

(10) Patent No.: US 11,864,473 B2
(45) Date of Patent: Jan. 2, 2024

(54) RESISTIVE RANDOM-ACCESS MEMORY DEVICE AND METHOD OF FABRICATING THE SAME

(71) Applicant: United Microelectronics Corp., Hsinchu (TW)

(72) Inventors: Wen-Jen Wang, Tainan (TW); Chun-Hung Cheng, Kaohsiung (TW); Chuan-Fu Wang, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 232 days.

(21) Appl. No.: 17/404,934

(22) Filed: Aug. 17, 2021

(65) Prior Publication Data
US 2023/0020564 A1    Jan. 19, 2023

(30) Foreign Application Priority Data
Jul. 19, 2021    (TW) .................................. 110126483

(51) Int. Cl.
*G11C 11/00* (2006.01)
*H10N 70/00* (2023.01)
*H10B 63/00* (2023.01)

(52) U.S. Cl.
CPC ........... *H10N 70/021* (2023.02); *H10B 63/80* (2023.02); *H10N 70/063* (2023.02); *H10N 70/068* (2023.02); *H10N 70/841* (2023.02); *H10N 70/8833* (2023.02)

(58) Field of Classification Search
CPC ............. H10N 70/021; H10N 70/8833; H10N 70/841; H10N 70/063; H10N 70/068; H10B 63/80

USPC .......................................................... 365/148
See application file for complete search history.

(56) References Cited

U.S. PATENT DOCUMENTS

| | | | |
|---|---|---|---|
| 7,521,705 B2 * | 4/2009 | Liu ..................... | H10N 70/8418 438/102 |
| 8,258,038 B2 * | 9/2012 | Nozawa ............... | H10N 70/823 257/E21.004 |
| 9,553,265 B1 * | 1/2017 | Yang .................... | H10N 70/821 |
| 9,806,255 B1 * | 10/2017 | Hsu ....................... | H10N 70/826 |
| 9,837,605 B2 * | 12/2017 | Hsieh ................... | H10N 70/841 |
| 10,014,469 B2 * | 7/2018 | Lee ....................... | H10N 70/821 |
| 10,522,755 B2 * | 12/2019 | Hsu ....................... | H10N 70/841 |
| 10,862,247 B2 * | 12/2020 | Hashimoto ............ | H01R 24/50 |
| 11,101,323 B2 * | 8/2021 | Kong ..................... | H10B 63/30 |
| 11,489,118 B2 * | 11/2022 | Li .......................... | H10N 70/063 |
| 2016/0118584 A1 * | 4/2016 | Yang ..................... | H10B 63/30 438/382 |
| 2020/0266346 A1 * | 8/2020 | Mo ........................ | H10N 70/245 |
| 2022/0069210 A1 * | 3/2022 | Hsu ....................... | H10N 70/24 |
| 2022/0246845 A1 * | 8/2022 | Hsu ....................... | H10N 70/8833 |
| 2022/0336740 A1 * | 10/2022 | Kong .................... | H10N 70/841 |

* cited by examiner

*Primary Examiner* — Viet Q Nguyen
(74) *Attorney, Agent, or Firm* — J.C. PATENTS

(57) ABSTRACT

Provided is a resistive random-access memory device, including a dielectric layer located on a substrate, a first electrode which is a column located on the dielectric layer, a second electrode covering a top surface and a sidewall of the first electrode, and a variable resistance layer sandwiched between the top surface of the first electrode and the second electrode and between the sidewall of the first electrode and the second electrode and located between the second electrode and the dielectric layer.

19 Claims, 5 Drawing Sheets

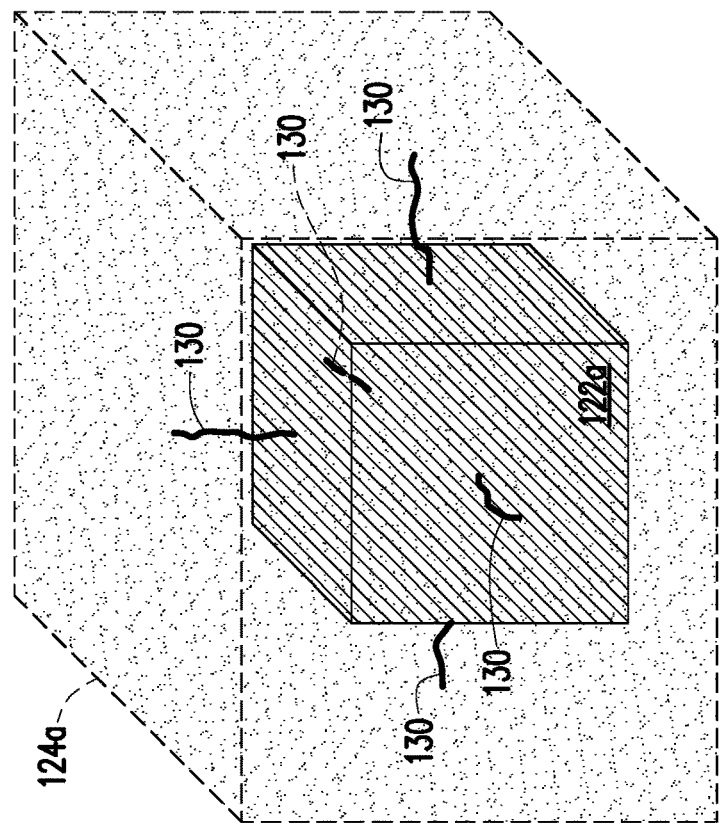
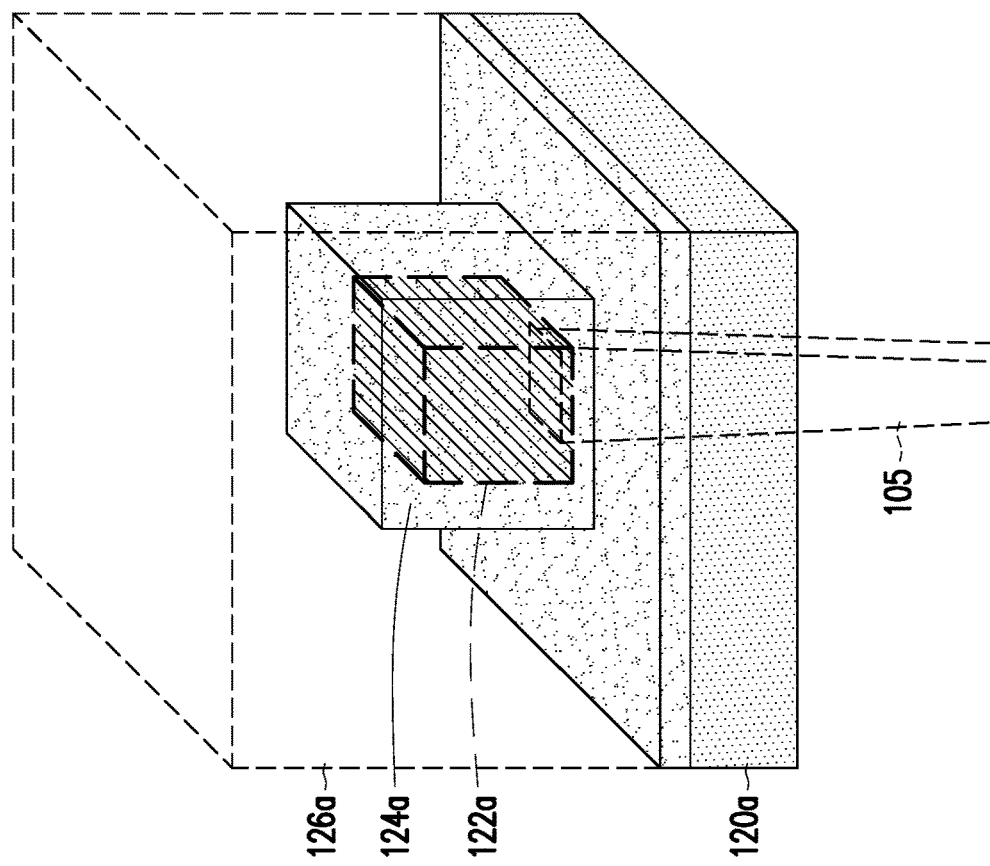
FIG. 4
FIG. 3

RESISTIVE RANDOM-ACCESS MEMORY DEVICE AND METHOD OF FABRICATING THE SAME

CROSS-REFERENCE TO RELATED APPLICATION

This application claims the priority benefit of Taiwan application serial no. 110126483, filed on Jul. 19, 2021. The entirety of the above-mentioned patent application is hereby incorporated by reference herein and made a part of this specification.

BACKGROUND

Technical Field

The disclosure relates to a memory device and a method of fabricating the same, and more particularly to a resistive random-access memory (RRAM) and a method of fabricating the same.

Description of Related Art

A resistive random-access memory is a non-volatile memory that has been widely studied in recent years with advantages such as fast operation speed and low power consumption. During SET operation of a resistive random-access memory cell, a variable resistance layer between two electrodes forms conductive filaments and presents a conducting state. At this time, the variable resistance layer switches from a high resistance state (HRS) to a low resistance state (LRS). During RESET operation of the resistive random-access memory cell, a negative bias is applied to the resistive random-access memory, breaking the conductive filaments and presenting a non-conducting state. At this time, the variable resistance layer switches from the LRS to the HRS. However, an insufficient number of the conductive filaments generated in the variable resistance layer may result in an insufficient electric current amount in the LRS.

SUMMARY

The embodiments of the disclosure provide a resistive random-access memory cell and a method of fabricating the same, which may increase the number of conductive filaments in a variable resistance layer and improve the electric current amount in a low resistance state (LRS).

The embodiments of the disclosure provide a resistive random-access memory device, including a dielectric layer, a first electrode, a second electrode, and a variable resistance layer. The dielectric layer is located on a substrate. The first electrode is located on the dielectric layer, and the first electrode is a column. The second electrode covers a sidewall and a top surface of the first electrode. The variable resistance layer is sandwiched between the top surface of the first electrode and the second electrode and between the sidewall of the first electrode and the second electrode, and is located between the second electrode and the dielectric layer.

The embodiments of the disclosure provide a method of fabricating a resistive random-access memory device, including the following steps. A dielectric layer is formed on a substrate. A first electrode material layer is formed on the dielectric layer. The first electrode material layer is patterned to form a first electrode. A variable resistance layer is formed on a top surface and a sidewall of the first electrode and the dielectric layer. A second electrode material layer is formed on the variable resistance layer. The second electrode material layer and the variable resistance layer are patterned to form a second electrode and a variable resistance layer. The variable resistance layer is sandwiched between the top surface of the first electrode and the second electrode and between the sidewall of the first electrode and the second electrode, and is located between the second electrode and the dielectric layer.

Based on the above, the resistive random-access memory cell and the method of fabricating the same in the embodiments of the disclosure may increase the number of conductive filaments in the variable resistance layer and improve the electric current amount in the LRS.

BRIEF DESCRIPTION OF THE DRAWINGS

FIG. 3 is a partial perspective view of a resistive random-access memory cell according to the embodiments of the disclosure.

FIG. 4 is a partial enlarged view of FIG. 3.

DESCRIPTION OF THE EMBODIMENTS

Figure 1B:
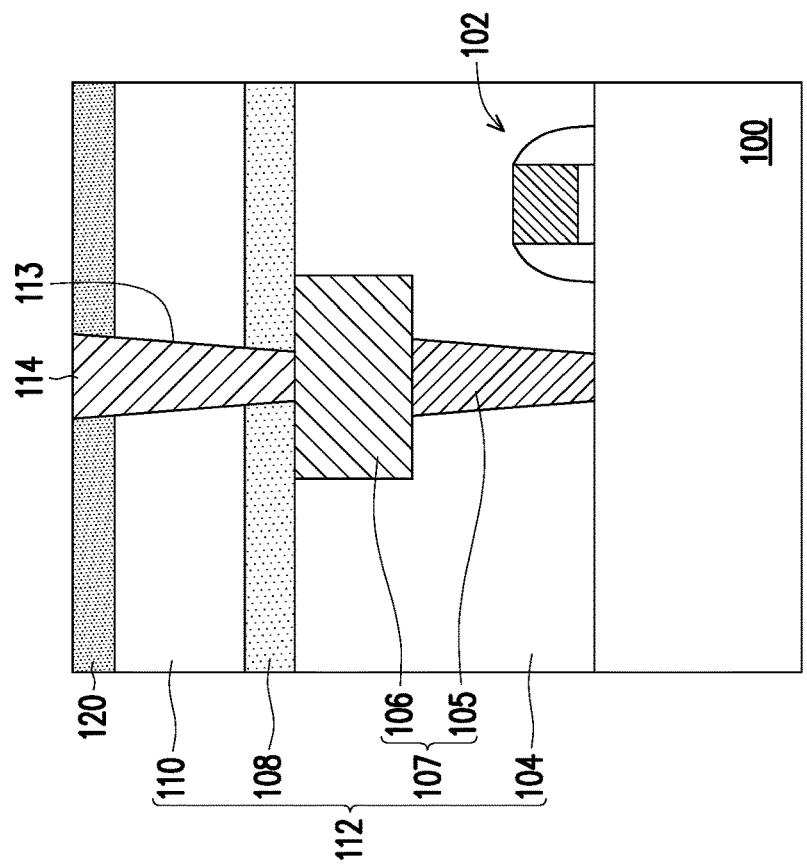
FIG. 1A to FIG. 1G are schematic cross-sectional views of a method of fabricating a resistive random-access memory according to the embodiments of the disclosure.
Figure 1A:
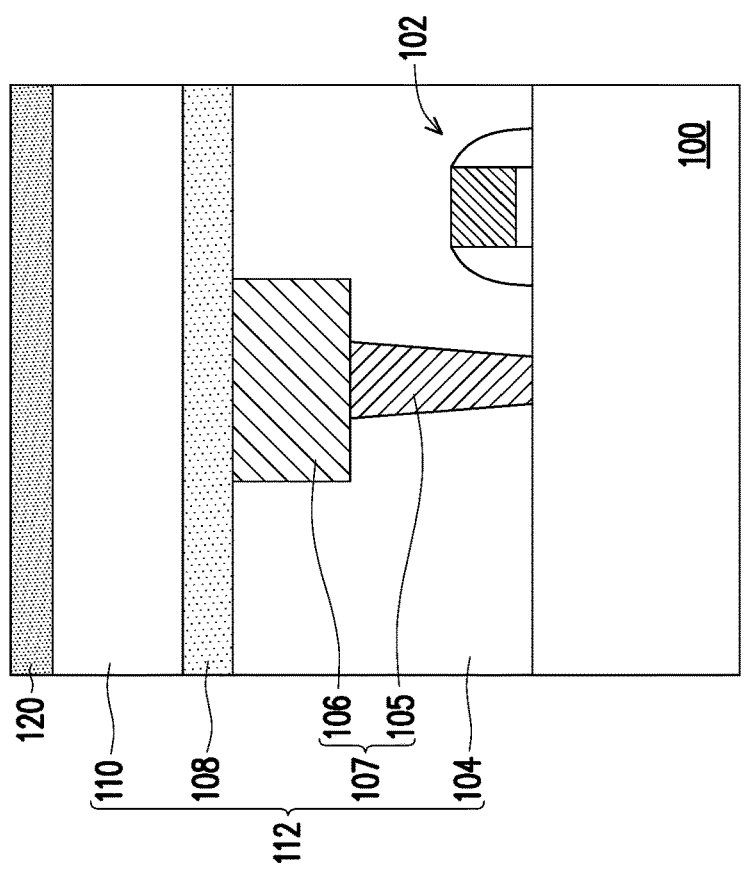

With reference to FIG. 1A, a substrate 100 is provided. The substrate 100 may be a semiconductor substrate, such as a doped or undoped silicon lump, or an active layer of a silicon-on-insulator (SOI) substrate. A device layer 102 may be formed on the substrate 100. The device layer 102 may include an active device or a passive device. The active device is, for example, a transistor, a diode, or the like. The passive device is, for example, a capacitor, a resistor, an inductor, or the like. The transistor may be an N-type metal-oxide-semiconductor (NMOS) transistor, a P-type metal-oxide-semiconductor (PMOS) transistor, or a complementary metal-oxide-semiconductor (CMOS) device. The transistor may be a planar transistor, a fin field effect transistor (FinFET), a nanowire transistor, or the like. The device layer 102 may be formed by using any suitable method.

With reference to FIG. 1A, a metal interconnect structure 112 is formed on the device layer 102. The metal interconnect structure 112 may be formed of alternate layers of dielectric materials and conductive materials, and may be formed through any suitable process (such as deposition, damascene, or dual damascene). The metal interconnect structure 112 may include dielectric layers 104 and 110 and a metal interconnect 107 formed in multiple dielectric layers 104. The metal interconnect 107 may be electrically connected to the device layer 102. The metal interconnect 107 may include a plug 105, a wire 106, and the like. The material of the plug 105 and the wire 106 includes a barrier layer (or an adhesive layer) and a metal layer formed on the barrier layer. The barrier layer is, for example, a composite layer of titanium, titanium nitride, tantalum, tantalum nitride, or a combination thereof. The metal layer is, for example, tungsten or copper.

FIG. 1A to FIG. 1G only illustrate one single dielectric layer 104, one single plug 105, and one single wire 106. However, the metal interconnect structure 112 may include multiple dielectric layers 104, multiple plugs 105, and multiple wires 106. The dielectric layer 104 separates the wires 106 adjacent to each other. The wires 106 may be connected by the plug 105, and the wires 106 may be connected to the device layer 102 through the plug 105. In some embodiments, the metal interconnect structure 112 further includes a stop layer 108. The stop layer 108 may be disposed between the dielectric layer 104 and the dielectric layer 110. Different from the material of the dielectric layers 104 and 110, the material of the stop layer 108 is, for example, nitrogen-doped silicon carbide (NDC), silicon nitride, silicon oxynitride, silicon carbide, or a combination thereof. A method of forming the stop layer 108 is, for example, a chemical vapor deposition method. The dielectric layer 110 may be a flatten layer planarized through a chemical mechanical polishing process.

With reference to FIG. 1A, a barrier material layer 120 is formed on the dielectric layer 110. The barrier material layer 120 may be a nitrogen-containing dielectric material layer, such as silicon nitride. A method of forming the barrier material layer 120 is, for example, the chemical vapor deposition method. The barrier material layer 120 may block the metal (such as copper) in the wire 106 from diffusing and subsequently being formed in the film thereon.

With reference to FIG. 1B, a via 114 is formed in the barrier material layer 120, the dielectric layer 100, and the stop layer 108 to be electrically connected to the wire 106. A method of forming the via 114 is as described below. Photolithography and etching processes are performed to form a via hole 113 in the barrier material layer 120, the dielectric layer 100, and the stop layer 108. Next, a conductive material layer is formed on the barrier material layer 120 and in the via hole 113. The conductive material layer includes a metal layer, a barrier layer (or an adhesion layer), and a metal layer formed on the barrier layer. The barrier layer is, for example, a composite layer of titanium, titanium nitride, tantalum, tantalum nitride, or a combination thereof. The metal layer is, for example, tungsten. After that, a planarization process, such as the chemical mechanical polishing process, is performed to remove the conductive material layer on the barrier material layer 120. In some embodiments, a top surface of the via 114 is coplanar with a top surface of the barrier material layer 120.

Figure 1C:
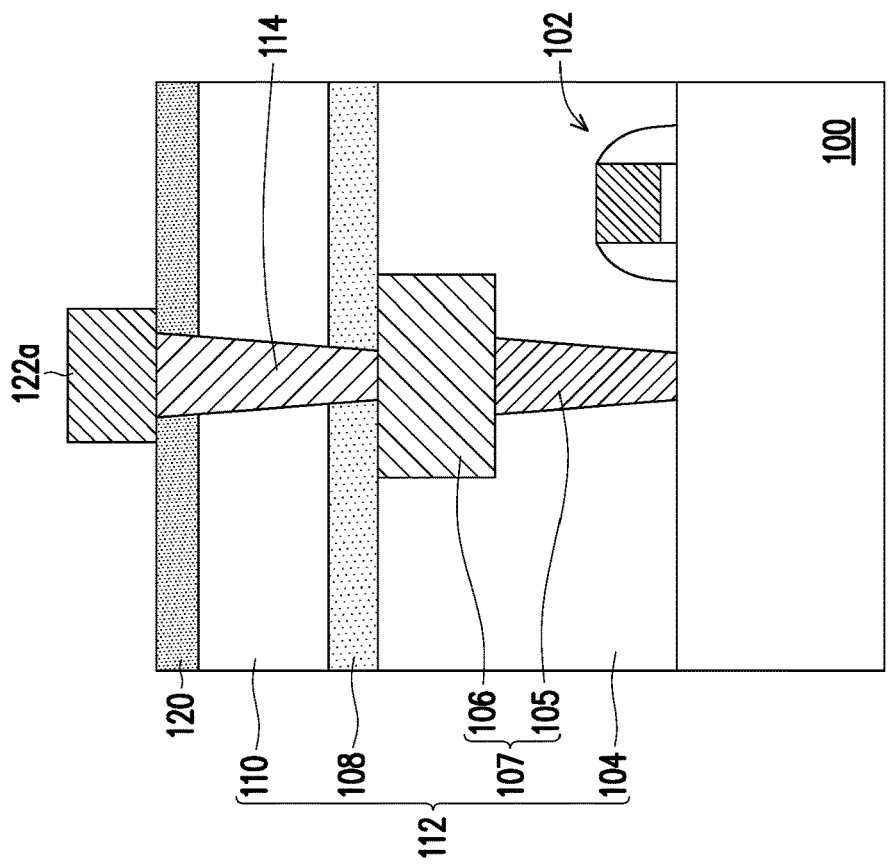

With reference to FIG. 1C, a first electrode material layer 122 is formed on the barrier material layer 120. The first electrode material layer 122 is, for example, titanium nitride (TiN), tantalum nitride (TaN), titanium aluminum nitride (TiAlN), titanium tungsten (TiW) alloy, platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Gd), molybdenum (Mo), graphite or a combination of the above materials.

Figure 1D:
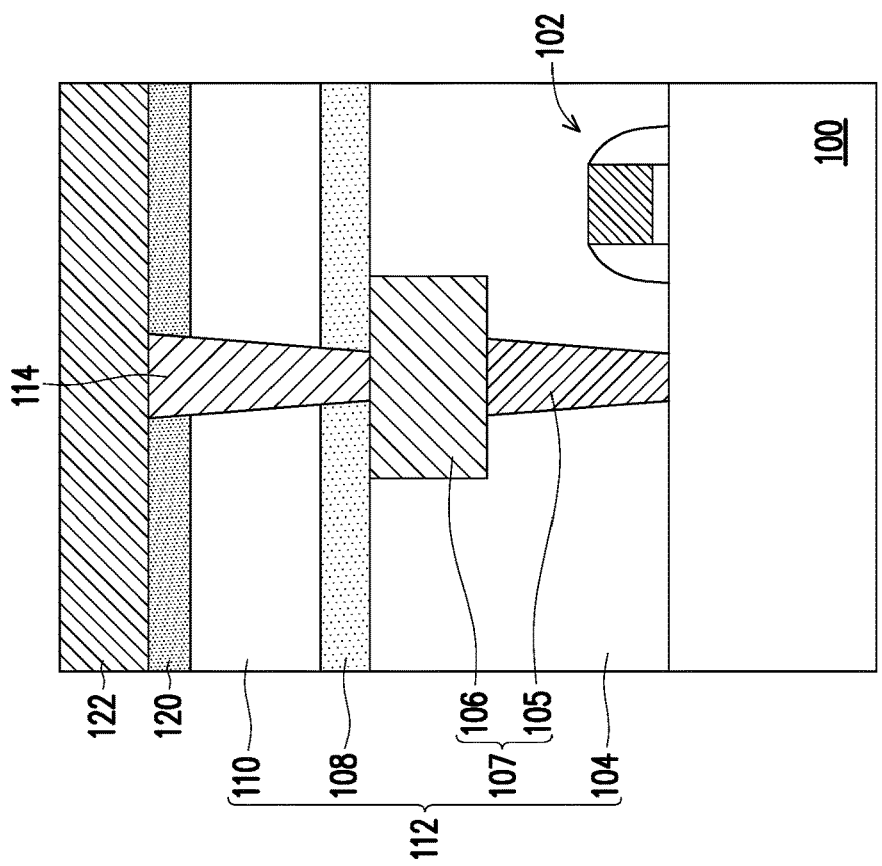
Figure 2A:
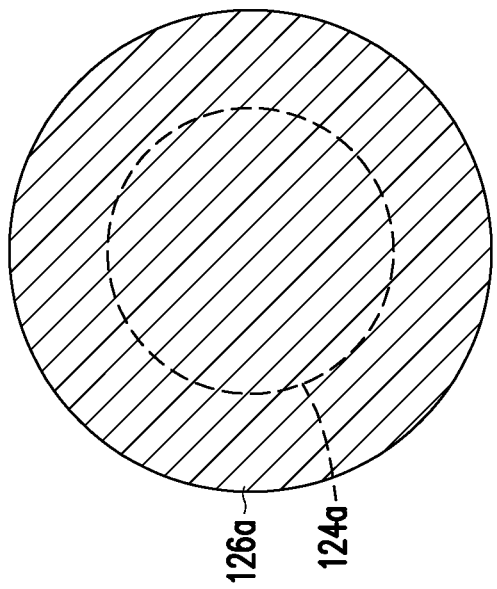
FIG. 2A and FIG. 2B are top views of various resistive random-access memories according to the embodiments of the disclosure.
Figure 2B:
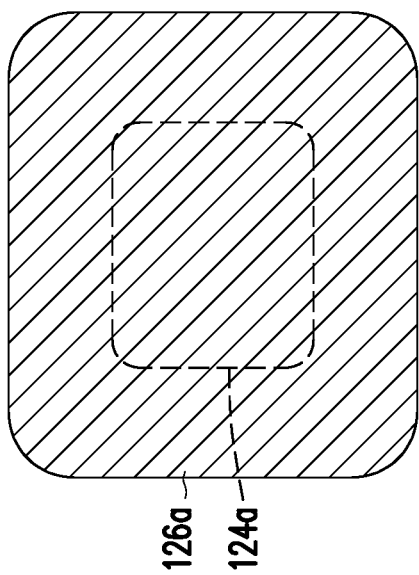

With reference to FIG. 1D, the photolithography and etching processes are performed to pattern the first electrode material layer 122 for forming a first electrode 122a electrically connected to the via 114. The first electrode 122a is a column, such as a cylinder or a hexahedron (as shown in FIG. 3 and FIG. 4). The top view of a top surface of the first electrode 122a may be a circle, a rectangle with rounded corners, or the like, as respectively shown in FIG. 2A and FIG. 2B. The top view of the top surface of the first electrode 122a may also be various shapes, such as an ellipse.

Figure 1E:
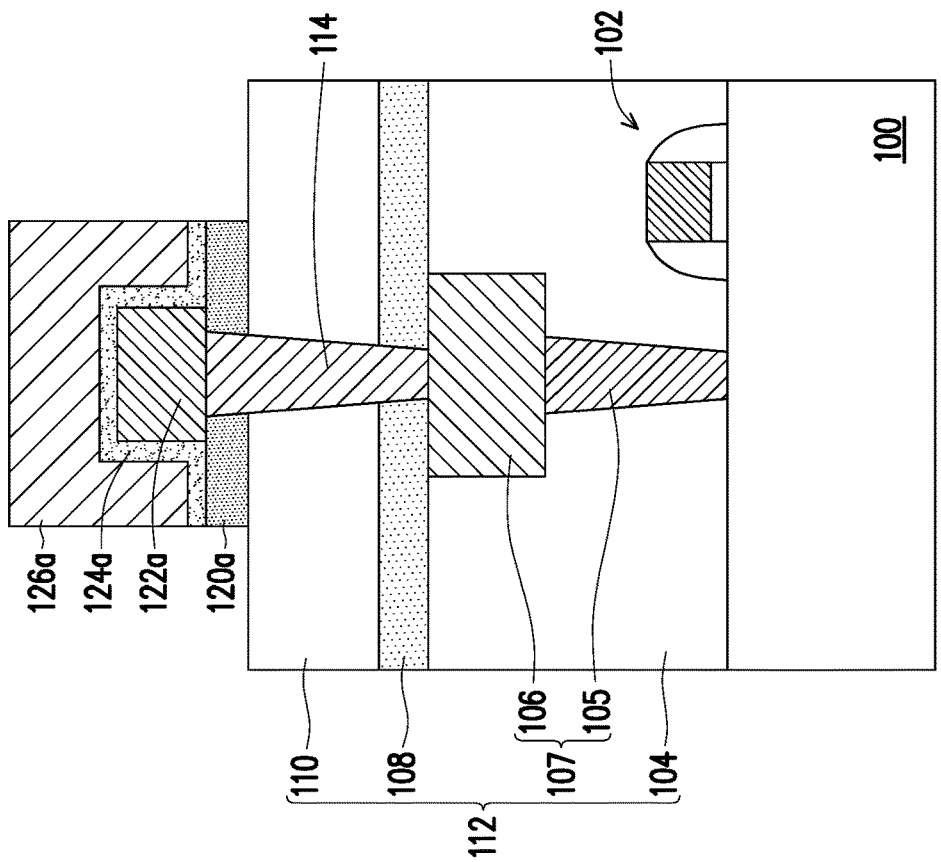

With reference to FIG. 1E, a variable resistance material layer 124 is formed on the top surface and a sidewall of the first electrode 122a and the barrier material layer 120. In some embodiments, the variable resistance material layer 124 is a conformal layer, conformally covering the top surface and the sidewall of the first electrode 122a and the barrier material layer 120. In some embodiments, the barrier material layer 120 is a flatten layer, so a bottom surface of the variable resistance material layer 124 is coplanar with a bottom surface of the first electrode 122a. A material of the variable resistance material layer 124 includes metal oxide, such as hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminum oxide ($Al_2O_3$), vanadium oxide ($V_2O_5$), tungsten oxide ($WO_3$), zinc oxide (ZnO), or cobalt oxide (CoO).

Figure 1F:
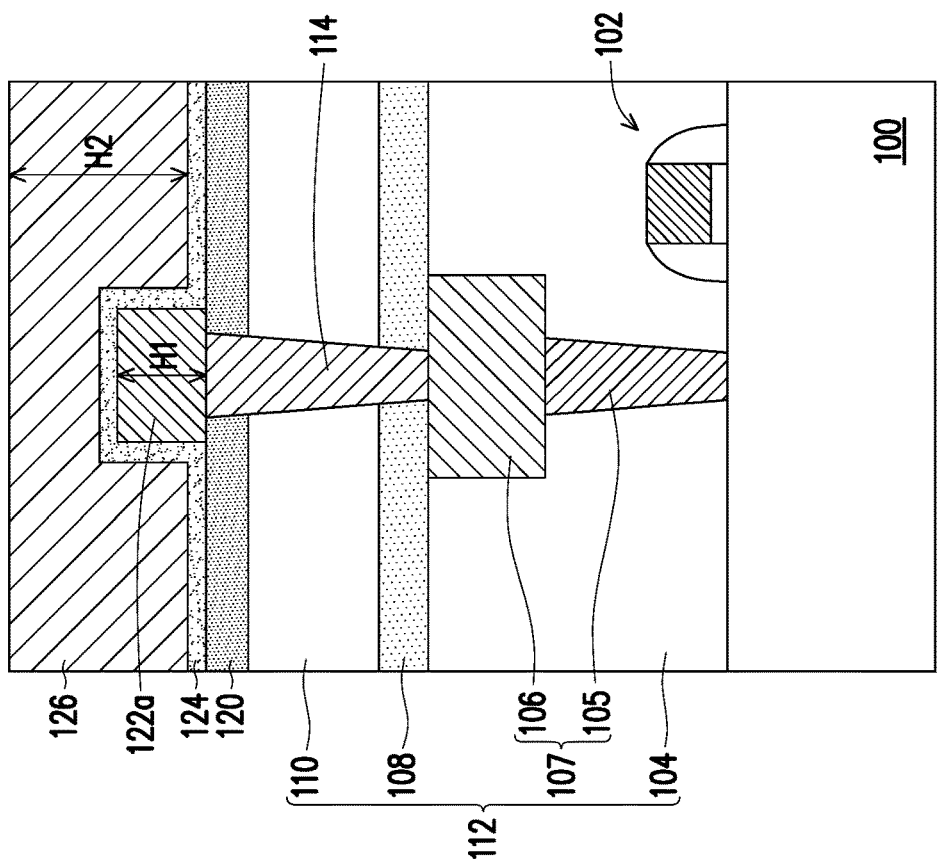

With reference to FIG. 1F, a second electrode material layer 126 is formed on the variable resistance material layer 124. The second electrode material layer 126 is, for example, titanium nitride (TiN), tantalum nitride (TaN), titanium aluminum nitride (TiAlN), titanium tungsten (TiW) alloy, platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Gd), molybdenum (Mo), graphite or a combination of the above materials. The second electrode material layer 126 may be single-layer or double-layer. In some embodiments, the second electrode material layer 126 is double-layer, where an upper layer may be titanium nitride or tantalum nitride, and a lower layer may be iridium. A thickness H2 of the second electrode material layer 126 may be greater than, equal to, or less than a thickness H1 of the first electrode 122a. The second electrode material layer 126 may have a flat surface (as shown in FIG. 1E) or be conformal with the variable resistance material layer 124 (not shown).

With reference to FIG. 1F, the photolithography and etching processes are performed to pattern the second electrode material layer 126, the variable resistance material layer 124, and the barrier material layer 120 for forming a second electrode 126a, a variable resistance layer 124a, and a barrier pad 120a. In some embodiments, the second electrode 126a, the variable resistance layer 124a, and the barrier pad 120a have sidewalls flush with each other.

Figure 1G:
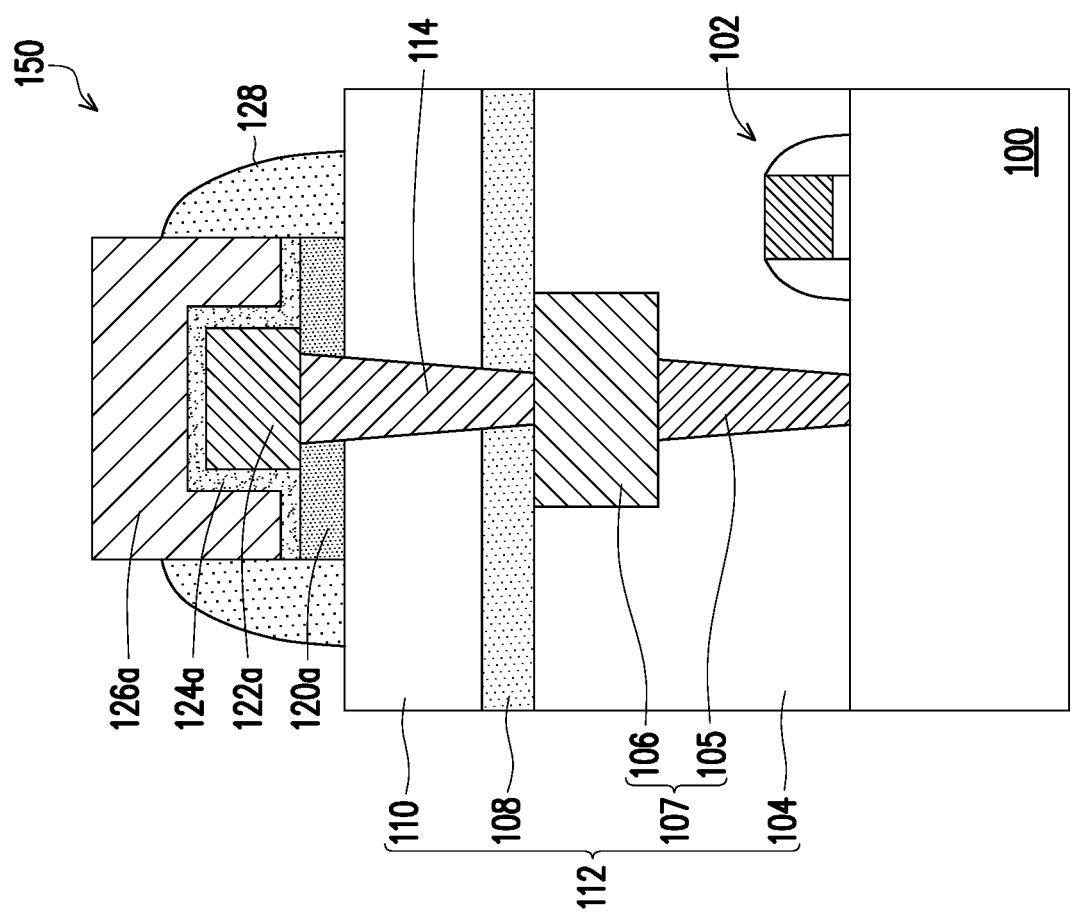

With reference to FIG. 1G, a spacer 128 is formed on the sidewalls of the second electrode 126a, the variable resistance layer 124a, and the barrier pad 120a. The spacer 128 includes a nitrogen-containing dielectric material layer, such as silicon nitride. The spacer 128 and the barrier pad 120a may include a same material. The spacer 128 is formed, for example, by forming a spacer material layer first to cover the sidewalls of the second electrode 126a, the variable resistance layer 124a, and the barrier pad 120a and the surface of the dielectric layer 110. Next, an anisotropic etching process is performed.

By this time, a resistive random-access memory 150 is formed. The resistive random-access memory 150 has the spacer 128 and the barrier pad 120a, which respectively cover a sidewall and a bottom surface of the variable resistance layer 124a, and the spacer 128 extends upward to cover a lower sidewall of the second electrode 126. In some embodiments, the spacer 128 covers one half to two thirds of the sidewall of the second electrode 126. The spacer 128 and the barrier pad 120a may jointly block moisture, metal atoms (such as copper atoms), or oxygen from diffusing into the variable resistance layer 124a.

With reference to FIG. 1G and FIG. 3, the first electrode 122a of the resistive random-access memory 150 in the embodiment of the disclosure is a column. The variable resistance layer 124a is sandwiched between the top surface of the first electrode 122a and the second electrode 126a and between the sidewall of the first electrode 122a and the second electrode 126a. Moreover, the variable resistance layer 124a is located between a bottom surface of the second electrode 126a and the barrier pad 120a. The variable resistance layer 124a may be separated from the dielectric layer 110 by a non-zero distance by the barrier pad 120a to avoid contact with the dielectric layer 110, thereby avoiding oxygen in the dielectric layer 110 from diffusing to the variable resistance layer 124a.

With reference to FIG. 1G and FIG. 4, during SET operation, a positive voltage is applied to the resistive random-access memory 150, and oxygen ions in the variable resistance layer 124a are attracted away by the positive voltage to generate oxygen vacancies, thereby forming a conductive filament 130 and presenting a conductive state. At this time, the variable resistance layer switches from a high resistance state (HRS) to a low resistance state (LRS). During RESET operation, a negative bias is applied to the resistive random-access memory 150, and the oxygen ions return to the variable resistance layer 124a, breaking the conductive filament 130 and presenting a non-conductive state. At this time, the variable resistance layer switches from the LRS to the HRS. In the embodiment of the disclosure, since the first electrode 122a is a column, and the variable resistance layer 124a covers a top surface and a sidewall of the column, multiple conductive filaments 130 may be formed in the variable resistance layer 124a on the top surface and the sidewall of the first electrode 122a.

The structure of the resistive random-access memory in the embodiment of the disclosure may form conductive filaments in more areas, and thus may increase the electric current amount of the resistive random-access memory cell in the LRS.

What is claimed is:

1. A resistive random-access memory device, comprising:
   a dielectric layer, located on a substrate; and
   a first electrode, located on the dielectric layer, wherein the first electrode is a column;
   a second electrode, covering sidewalls and a top surface of the first electrode;
   a variable resistance layer, sandwiched between the top surface of the first electrode and the second electrode and between the sidewall of the first electrode and the second electrode, and located between the second electrode and the dielectric layer; and
   a barrier pad, located on the dielectric layer, wherein a top surface of the barrier layer is in contact with a bottom surface of the first electrode and a bottom surface of the variable resistance layer.

2. The resistive random-access memory device according to claim 1, wherein a top surface of the second electrode is circular or rectangular with rounded corners.

3. The resistive random-access memory device according to claim 1, wherein a bottom surface of the second electrode is ring-shaped.

4. The resistive random-access memory device according to claim 1, wherein the bottom surface of the variable resistance layer is coplanar with the bottom surface of the first electrode.

5. The resistive random-access memory device according to claim 1, wherein the variable resistance layer is separated from the dielectric layer by a non-zero distance.

6. The resistive random-access memory device according to claim 5, wherein:
   the barrier pad separates the bottom surface of the variable resistance layer from the dielectric layer.

7. The resistive random-access memory device according to claim 1, wherein the barrier pad comprises a nitrogen-containing dielectric material layer.

8. The resistive random-access memory device according to claim 7, wherein a material of the nitrogen-containing dielectric material layer comprises silicon nitride.

9. The resistive random-access memory device according to claim 1, further comprising:
   a spacer, at least covering a sidewall of the variable resistance layer.

10. The resistive random-access memory device according to claim 9, wherein the spacer further extends to cover a lower sidewall of the second electrode and a sidewall of the barrier pad.

11. The resistive random-access memory device according to claim 9, wherein the spacer comprises a nitrogen-containing dielectric material layer.

12. The resistive random-access memory device according to claim 11, wherein a material of the nitrogen-containing dielectric material layer comprises silicon nitride.

13. The resistive random-access memory device according to claim 9, wherein the spacer and the barrier pad comprise a same material.

14. A method of fabricating a resistive random-access memory device, comprising:
    forming a dielectric layer on a substrate;
    forming a first electrode material layer on the dielectric layer;
    patterning the first electrode material layer to form a first electrode;
    forming a variable resistance material layer on sidewalls and a top surface of the first electrode and the dielectric layer;
    forming a second electrode material layer on the variable resistance material layer; and
    patterning the second electrode material layer and the variable resistance material layer to form a second electrode and a variable resistance layer, wherein
    the second electrode covers the sidewalls and the top surface of the first electrode;
    the variable resistance layer is sandwiched between the top surface of the first electrode and the second electrode and between the sidewall of the first electrode and the second electrode, and is located between the second electrode and the dielectric layer;
    forming a barrier pad on the dielectric layer, wherein a top surface of the barrier layer is in contact with a bottom surface of the first electrode and a bottom surface of the variable resistance layer.

15. The method of fabricating the resistive random-access memory device according to claim 14, wherein the forming the barrier layer comprises:
    forming a barrier material layer on the dielectric layer before forming the first electrode material layer; and
    patterning the barrier material layer to form the barrier pad after patterning the second electrode material layer and the variable resistance material layer.

16. The method of fabricating the resistive random-access memory device according to claim 15, further comprising:
    forming a spacer on the second electrode, the variable resistance layer, and a sidewall of the barrier pad.

17. The method of fabricating the resistive random-access memory device according to claim 16, wherein the spacer and the barrier material layer comprise a same material.

18. The method of fabricating the resistive random-access memory device according to claim 16, wherein the spacer and the barrier material layer comprise a nitrogen-containing dielectric material layer.

19. The method of fabricating the resistive random-access memory device according to claim 18, wherein a material of the nitrogen-containing dielectric material layer comprises silicon nitride.

* * * * *